(12) United States Patent
Nagase et al.

(10) Patent No.: US 7,027,941 B2
(45) Date of Patent: Apr. 11, 2006

(54) DEVICE AND METHOD FOR CALCULATING ELECTRO-MAGNETIC FIELD INTENSITY BY COOPERATION OF CIRCUIT ANALYSES AND ELECTRO-MAGNETIC WAVE ANALYSES

(75) Inventors: Kenji Nagase, Kawasaki (JP); Takashi Yamagajo, Kawasaki (JP); Shinichi Ohtsu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/146,326

(22) Filed: Jun. 7, 2005

(65) Prior Publication Data

US 2005/0228601 A1 Oct. 13, 2005

Related U.S. Application Data

(63) Continuation of application No. PCT/JP2003/007156, filed on Jun. 5, 2003.

(51) Int. Cl.
*G01R 13/00* (2006.01)
(52) U.S. Cl. .................................. 702/66; 324/247
(58) Field of Classification Search ................ 702/56, 702/57, 64, 65, 66, 69, 110, 115, 172, 183, 702/189, 190; 324/96, 247, 244.1, 633; 703/5, 703/13; 716/3, 7
See application file for complete search history.

(56) References Cited

U.S. PATENT DOCUMENTS

| | | | |
|---|---|---|---|
| 6,129,459 A | 10/2000 | Kishimoto et al. | |
| 6,219,629 B1* | 4/2001 | Namiki | 703/13 |
| 6,373,972 B1* | 4/2002 | Nonomura | 382/133 |
| 6,456,949 B1* | 9/2002 | Yamagajo et al. | 702/65 |
| 6,604,225 B1* | 8/2003 | Otsu et al. | 716/3 |
| 6,617,860 B1* | 9/2003 | Uesaka et al. | 324/633 |

FOREIGN PATENT DOCUMENTS

| | | |
|---|---|---|
| JP | 11-94889 | 4/1999 |
| JP | 11-153634 | 6/1999 |
| JP | 2000-330973 | 11/2000 |

OTHER PUBLICATIONS

J. A. Landt, "Network Loading of Thin-Wire Antennas and Scatterers in the Time Domain", Los Alomos National Laboratory, Radio Science, vol. 16, No. 6, pp. 1241-1247.
Kenji Nagase et al., "Noise Simulation by Combination between Time Domain Moment Method and Non-Linear Analysis", Production Engineering Headquarters, Fujitsu Limited, Mar. 2003. pp. 1-2.
Shinji Tanabe et al., "EMI Simulator to which Coupling Analysis Can be Applied-Fusion of FDTD Electro-Magnetic Field Analysis and SPICE Circuit Analysis", Mitsubishi Electric Engineering Co., Ltd., Technical Report, vol. 73, No. 4, (1999).

* cited by examiner

*Primary Examiner*—Marc S. Hoff
*Assistant Examiner*—Mohamed Charioui
(74) *Attorney, Agent, or Firm*—Staas & Halsey LLP

(57) ABSTRACT

In order to improve the speed of an electro-magnetic field intensity calculation process in a device capable of performing the cooperation process of a circuit analysis and an electro-magnetic wave analysis, the present invention comprises a determination unit 2 for determining whether a component constituting an electric circuit contained in an analysis target, an analysis processing unit 3 for analyzing an electro-magnetic wave emitted from the analysis target, using an analysis target model containing a linear component if all components are linear, and a cooperation process unit 4 for dividing the analysis target into a circuit analysis model to which a circuit analysis method should be applied, an electro-magnetic wave analysis model to which an electro-magnetic wave analysis should be applied and one or more ports for combining the two models and analyzing an electro-magnetic wave emitted from the analysis target, if one or more components are non-linear.

12 Claims, 16 Drawing Sheets

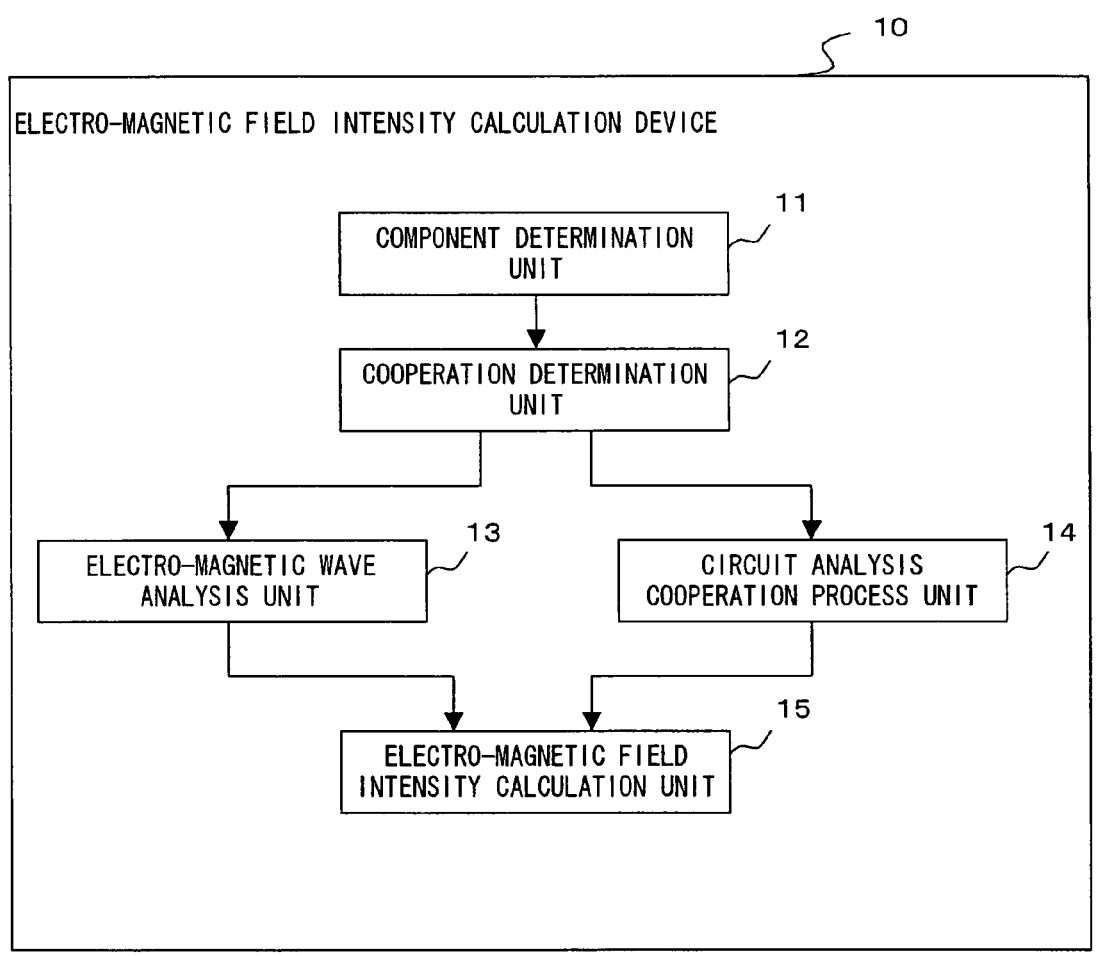
F I G. 3

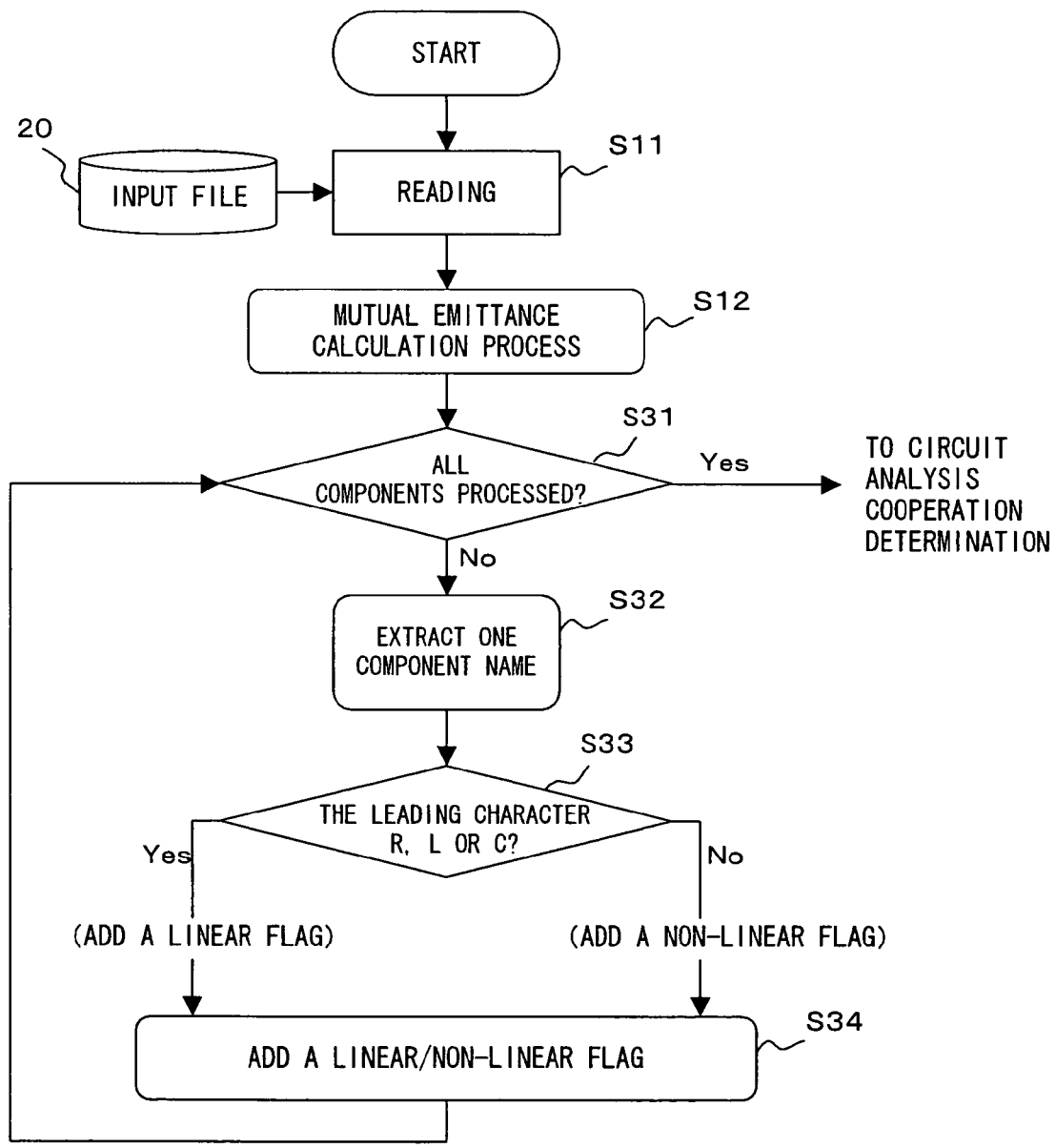
F I G. 6

```
M1 2 1 0 0 NMOS W=20000U L=5U
M2 2 1 3 3 PMOS W=40000U L=5U
VDD 3 0 PULSE(0 5 0 4N 2N 100N 300N)
VIN 1 0 PULSE(0 5 -3N 2N 2N 10N 30N)

C1 3 2 1p
L1 2 4   1Meg
R1 4 0 130              LINEAR
R4 2 70 50

T1 2 0 4 0 Z0=50 TD=1NS

X1         0   2       MOMENT
```

FIG. 7

```
C1 3 2 1p
L1 2 4   1Meg
R1 4 0 130
R4 2 70 50

$SPICE
M1 2 1 0 0 NMOS W=20000U L=5U
M2 2 1 3 3 PMOS W=40000U L=5U
VDD 3 0 PULSE(0 5 0 4N 2N 100N 300N)
VIN 1 0 PULSE(0 5 -3N 2N 2N 10N 30N)
T1 2 0 4 0 Z0=50 TD=1NS
$END
```

NON-LINEAR

FIG. 8

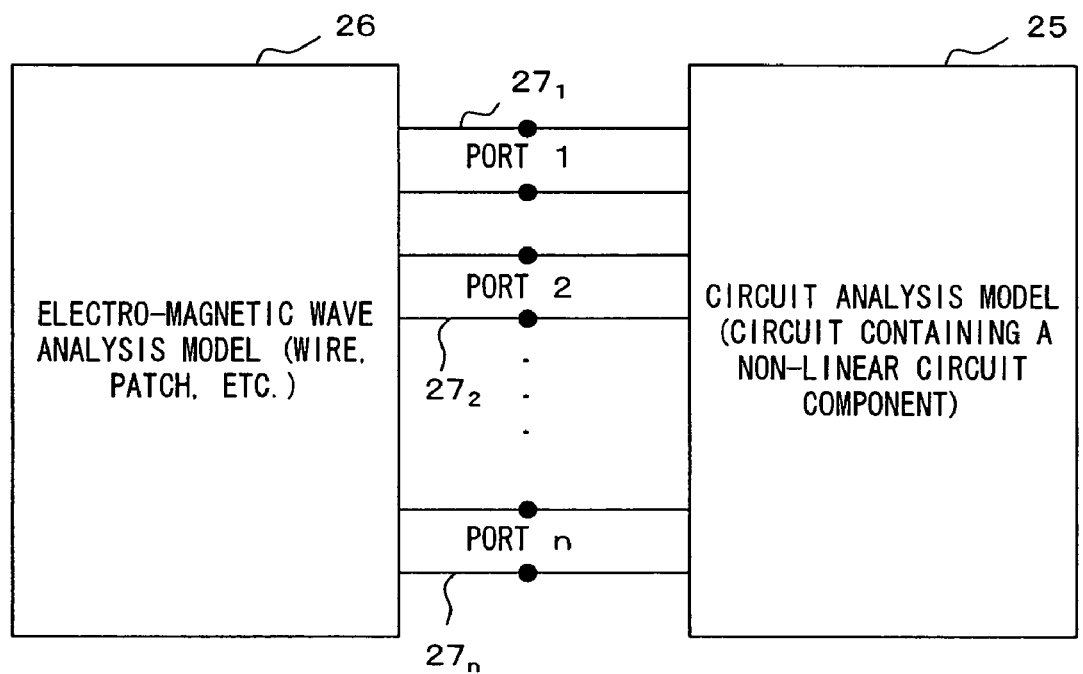
F I G. 1 0

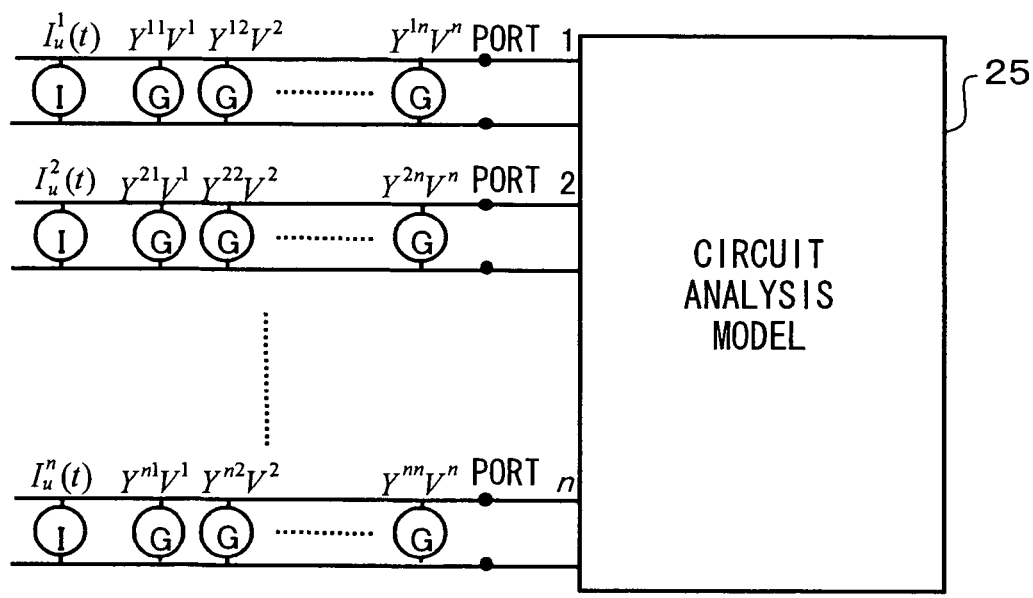
F I G. 1 3

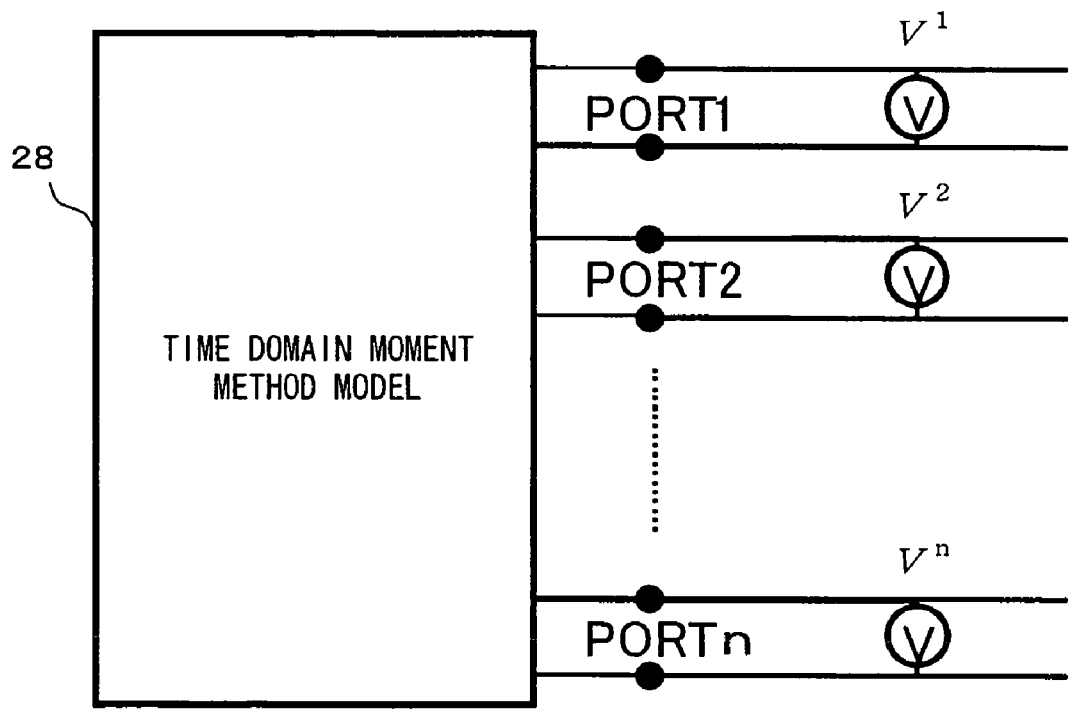
F I G. 1 4

DEVICE AND METHOD FOR CALCULATING ELECTRO-MAGNETIC FIELD INTENSITY BY COOPERATION OF CIRCUIT ANALYSES AND ELECTRO-MAGNETIC WAVE ANALYSES

CROSS REFERENCE TO RELATED APPLICATION

This application is a continuation of international PCT application No. PCT/JP2003/007156 filed on Jun. 5, 2003.

BACKGROUND OF THE INVENTION

1. Field of the Invention

The present invention relates to a calculation method of the electro-magnetic field intensity of an electro-magnetic wave emitted from electronic equipment or the like, and more particularly, relates to an electro-magnetic field intensity calculation device using a different electro-magnetic field intensity calculation method, depending on whether an component constituting an electric circuit contained in an analysis target is liner or non-linear.

2. Description of the Related Art

With the high performance and miniaturization of equipment, an electro-magnetic wave emitted from electronic equipment has been called in question. With the complication of a circuit, the countermeasures of mis-operation of equipment due to noise voltage or the like also need great labor.

As a method for simulating an electro-magnetic wave emitted from electronic equipment, there are a variety of electro-magnetic analysis methods, such as a moment method and the like. In the moment method, the print-wired board, metal plate or the like of electronic equipment is divided into planar components called "patches". Alternatively, for example, an antenna is divided into linear components called "wires". Then, they are analyzed.

When applying an emitted electro-magnetic wave analysis to electronic equipment containing a non-linear component or the like, not only an electro-magnetic wave analysis but also a circuit analysis must be combined.

As analysis methods in which an electro-magnetic wave analysis and a circuit analysis are combined, the following reference is published.

Non-patent reference 1

J. A. Landt, "Network Loading of Thin-wire Antennas and Scatters in the Time Domain", Radio Science, Vol. 16, pp 1241–1247 (1981).

This reference discloses the combination of an electro-magnetic wave analysis method called a "time domain moment method" and a circuit analysis method. In this analysis, a wire as an antenna is divided into a plurality of segments against an analysis target to which the antenna is connected, and an equation with n unknowns about unknown antenna current flowing through each segment and an equation with m unknowns about the current of a circuit network, thereby analyzing the electro-magnetic wave emitted from the analysis target.

When combining an electro-magnetic wave analysis and a circuit analysis thus, generally an analysis target is divided into a circuit analysis model containing a non-linear circuit component, an electro-magnetic wave analysis model composed of a wire, a patch and the like and a port for jointing the two models and is analyzed. However, in Non-patent reference 1, the analysis target is limited to the case of only one port and is analyzed, and a system represented by simultaneous equations with (n+m) unknowns is simplified into two systems of equations with n unknowns and equations with m unknowns, thereby capable of independently solving them. Then, antenna current is calculated and the electro-magnetic wave analysis is applied to the analysis target.

As another combination of a circuit analysis method and an electro-magnetic wave analysis method, there is the combination of a finite difference time domain (FDTD) electro-magnetic field analysis method and a circuit analysis method, which is disclosed by the following references.

Patent reference 1

Japanese Patent Application Publication No. H11-153634 "Simulation Device and Computer-readable Storage Medium Recording Simulation Program"

Patent reference 2

Japanese Patent Application Publication No. 2000-330973 "Hybrid Analysis Method for Combining Finite Difference Time Domain (FDTD) Electro-magnetic Field Intensity Method with Transient Electric Circuit Analysis Method and Hybrid FDTD Electro-magnetic Field/Transient Electric Circuit Analysis Device"

In the time domain moment method, a model itself is divided like an antenna is divided into segments, current flowing through the model is calculated and an electric or magnetic field intensity is calculated based on the calculated current. However, the FDTD method is characterized in that a space containing a model is divided into blocks and an electro-magnetic field intensity in the space can be directly calculated without calculating current.

Patent reference 1 discloses in a simulation apparatus cooperating an electromagnetic analysis and a circuit analysis, a simulation device capable of calculating a stable analysis result since the difference between a time when a transferred electric field intensity value is calculated and the time of an electric field intensity calculated by an electro-magnetic wave analysis reflecting the electric field intensity value decreases by transferring the electric field intensity value based on a circuit analysis (electric field intensity value of an area containing a circuit) to the electro-magnetic wave analysis when the time of the circuit analysis approaches a time when an electric field intensity should be calculated by the electro-magnetic wave analysis in a simulation device.

Patent reference 2 discloses a hybrid analysis method in which a FDTD method and a transient electric circuit analysis (TECA) method are combined.

By using simulation as an electro-magnetic wave countermeasure or a noise countermeasure, the cost-down of a prototype machine and measurement can be realized. As an actual simulator, a circuit simulator (such as SPICE, etc.) and an electro-magnetic field simulator (such as a simulator by the moment method, the FDTD method) are used for the noise and electro-magnetic countermeasures, respectively.

As described above, several combinations of an electro-magnetic wave analysis and a circuit analysis are proposed as a method for simulating an electro-magnetic wave emitted from electronic equipment containing a non-linear circuit component, such as a diode and the like. However, in Non-patent reference 1, the method can only be applied to a case where there is only one port as the jointing point of a model to which a circuit analysis should be applied and a model to which an electro-magnetic wave analysis should be applied, and cannot generally handle an analysis target in which a plurality of ports exist between the two model, which is a problem. Furthermore, in this reference, the voltage of the port of a transmission line without any failure is calculated, and cannot be calculated in a case where there is a hole in the ground layer or the like, which is another problem.

In the combination of the FDTD method and circuit analysis method like patent references 1 and 2, in order to, for example, calculate an electro-magnetic field intensity at a point 100 m away from a model, a space also including the point must be divided since the space including the model is divided into blocks, and the amount of calculation increases, which is another problem.

Since a space is divided into blocks, it is difficult to divide an antenna itself if an analysis target contains a linear component, such as a dipole antenna, a spiral antenna and the like, and sufficient calculation accuracy cannot be obtained, which is another problem.

Furthermore, when combining a circuit analysis method and an electro-magnetic wave analysis method, as described above, a port as the jointing point of the circuit analysis model and electro-magnetic wave analysis model is one corresponding to a circuit component constituting the electric circuit of an analysis target, generally corresponding to each of a plurality of components. Therefore, if the number of components is large, the linking process of the circuit analysis and electro-magnetic analysis takes time, which is another problem.

Generally, the respective calculation time intervals of a circuit simulator, such as SPICE, and an electro-magnetic wave simulator using the moment method or the like usually differ, and the matching of the times is needed. Therefore, the entire calculation time increases compared with a case where each of the simulators independently operates, which is another problem.

FIG. 1 shows this problem. In FIG. 1, times to be analyzed are plotted on the horizontal axis of each of the circuit analysis method and time domain moment method. However, at time t2 when the calculation of the moment method is made, no circuit analysis is made. Therefore, the calculation must be conducted after the time is returned, as shown below the horizontal axis of the circuit analysis side.

SUMMARY OF THE INVENTION

It is an object of the present invention to provide an electro-magnetic field intensity calculation device for improving the speed of an electro-magnetic field intensity calculation process by switching the process according to the result of determining whether a component constituting an electric circuit contained in an analysis target is a linear component or a non-linear component and a method thereof, in order to solve the above-mentioned problems.

The electro-magnetic field intensity calculation device of the present invention comprises at least a circuit component determination unit, an electro-magnetic wave analysis processing unit and a cooperation process unit for making a circuit analysis cooperate with an electro-magnetic wave analysis.

The circuit component determination unit determines whether a component constituting an electric circuit contained in an analysis target is a linear component or a non-linear component. This determination can be made in accordance with, for example, the name of a component. Alternatively, this determination can also be made in accordance with a symbol predetermined in data to be needed for the circuit analysis.

The electro-magnetic wave analysis processing unit analyzes an electro-magnetic wave emitted from the analysis target, using the analysis target model containing linear components if all the components constituting the electric circuit are linear. In the preferred embodiment, for example, a time domain moment method can also be used as this electro-magnetic wave analysis method.

The cooperation process unit divides the analysis target into a circuit analysis model to which the circuit analysis method should be applied, an electro-magnetic wave model to which the electro-magnetic wave analysis method should be applied and one or more ports as the jointing point of these two models if one or more of components constituting the electric circuit are non-linear, and analyzes an electro-magnetic wave emitted from the analysis target. In the preferred embodiment, as the electro-magnetic wave analysis and circuit analysis methods, for example, the time domain moment method and a modified nodal analysis method, respectively, can also be used.

Next, as the electro-magnetic field intensity calculation method of the present invention, a method for analyzing the electro-magnetic wave emitted from the analysis target by determining whether the component constituting an electric circuit contained in the analysis target is linear or non-linear, and analyzing an electro-magnetic wave emitted from the analysis target, using the analysis target model containing a linear component if all the components are linear and dividing the analysis target into a circuit analysis model to which a circuit analysis should be applied, an electro-magnetic wave analysis model to which an electro-magnetic wave analysis should be applied and one or more ports as the jointing point of these two models if one or more components are non-linear.

As described above, according to the present invention, it is determined whether a component constituting an electric circuit contained in an analysis target is linear or non-linear, and the electro-magnetic wave analysis method can be switched according to the determination result.

BRIEF DESCRIPTION OF DRAWINGS

FIG. 3 shows the basic configuration of the electro-magnetic field intensity calculation device of the present invention.

FIG. 6 is the detailed flowchart of the circuit component determination process.

FIG. 7 shows an example of the description of circuit component data (No. 1).

FIG. 8 shows an example of the description of circuit component data (No. 2).

FIG. 10 explains the modeling of an analysis target in the cooperation process of the circuit analysis and electro-magnetic wave analysis.

FIG. 13 explains an analysis target model in which the time domain moment method model is replaced by a current source.

FIG. 14 explains an analysis target model in which the circuit analysis model is replaced by a voltage source.

DESCRIPTION OF THE PREFERRED EMBODIMENTS

Figure 1:
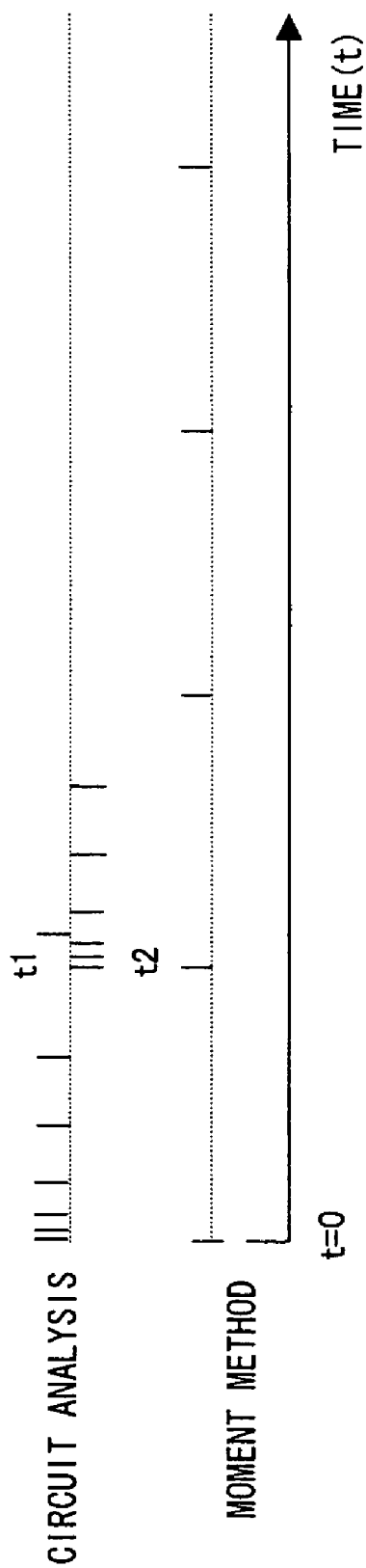
FIG. 1 shows a problem in the cooperation of a circuit analysis and an electro-magnetic wave analysis.
Figure 2:
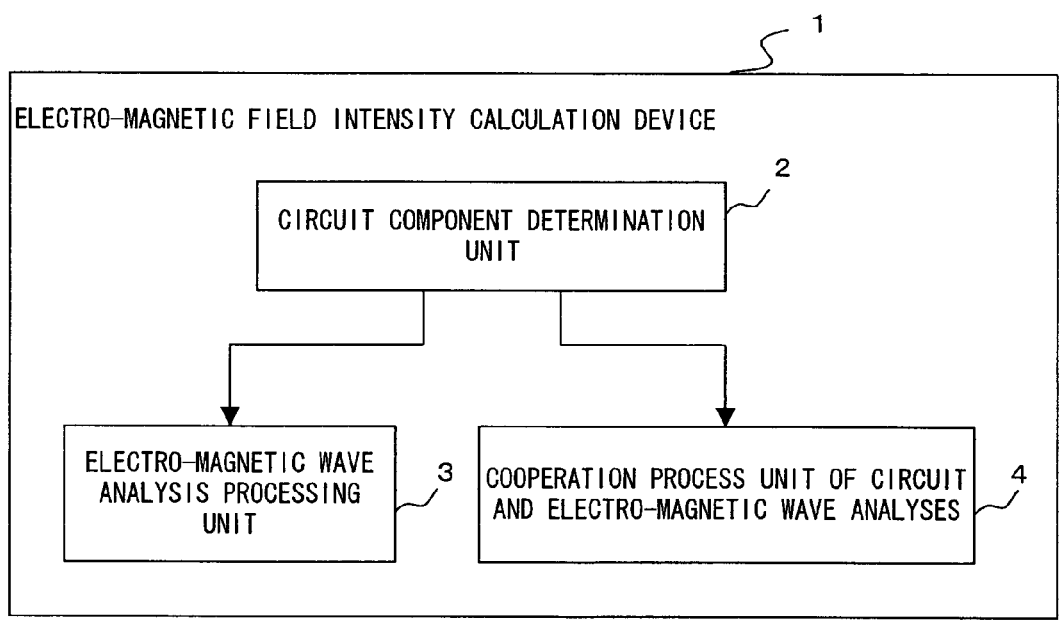
FIG. 2 shows the principle configuration of the electro-magnetic field intensity calculation device of the present invention.

FIG. 2 shows the principle configuration of the electro-magnetic field intensity calculation device of the present invention with cooperation of a circuit analysis and an electro-magnetic wave analysis. In FIG. 2, an electro-magnetic field intensity calculation device 1 comprises a circuit component determination unit 2, an electro-magnetic wave analysis processing unit 3 and a cooperation process unit 4 for making a circuit analysis cooperate with an electro-magnetic wave analysis.

The circuit component determination unit 2 determines whether a component constituting an electric circuit contained in an analysis target is a linear component or a non-linear component. In the preferred embodiment of this determination can be made in accordance with, for example, the name of a component. Alternatively, this determination can also be made in accordance with a symbol predetermined in data to be needed for the circuit analysis.

The electro-magnetic wave analysis processing unit 3 analyzes an electro-magnetic wave emitted from the analysis target, using the analysis target model containing linear components if all the components constituting the electric circuit are linear. In the preferred embodiment, for example, a time domain moment method can be used as this electro-magnetic wave analysis method.

The cooperation process unit 4 divides the analysis target into a circuit analysis model to which a circuit analysis method should be applied, an electro-magnetic wave model to which an electro-magnetic wave analysis method should be applied and one or more ports as the jointing point of these two models if one or more of components constituting the electric circuit are non-linear, and analyzes an electro-magnetic wave emitted from the analysis target. In the preferred embodiment, as the electro-magnetic wave analysis and circuit analysis methods, for example, a time domain moment method and a modified nodal analysis method, respectively, can also be used.

The cooperation process unit 4 can also dispose an independent current source and a voltage-dependent current source in each of one or more ports and calculate the voltage of each port, by a circuit analysis. Then, the cooperation process unit 4 can also dispose a voltage source in each port, using the calculated voltage value and calculate current flowing through the analysis target by the electro-magnetic wave analysis. Then, the cooperation process unit 4 can also repeat the voltage calculation of the port and the current calculation flowing through the analysis target by incrementing an analysis time in steps.

In this case, only a port corresponding to a non-linear component is provided as one or more ports, and the cooperation process unit 4 of a circuit analysis and an electro-magnetic wave analysis can also calculate current flowing through the analysis target, using the electro-magnetic wave analysis model containing a linear component in the electro-magnetic wave analysis.

In this case, furthermore the cooperation process unit 4 of a circuit analysis and an electro-magnetic wave analysis can also calculate current flowing through each port without any voltage applied to any of one or more ports, prior to voltage calculation by circuit analysis and set the independent current source, using the calculated current value.

When using a time domain moment method as the electro-magnetic wave analysis method, the cooperation process unit 4 can also divide an analysis target into very small components in order to apply the time domain moment method to it prior to voltage calculation by circuit analysis and set the voltage-dependent current source, using a part of admittance matrix elements which are admittances between the very small components.

In the electro-magnetic field intensity calculation method of the present invention, it is determined whether a component constituting an electric circuit contained in an analysis target is a linear component or a non-linear component, and an electro-magnetic wave emitted from the analysis target is analyzed using an analysis target model, containing a linear component if all the components are linear and dividing the analysis target into a circuit analysis model to which a circuit analysis should be applied, an electro-magnetic wave analysis model to which an electro-magnetic wave analysis should be applied and one or more ports as the jointing point of these two models and analyzing the electro-magnetic wave emitted from the analysis target if one or more components are non-linear.

Furthermore, a program for enabling a computer to implement this electro-magnetic field intensity calculation method and a computer-readable portable storage medium on which the program is recorded are used.

FIG. 3 shows the basic configuration of the electro-magnetic field intensity calculation device of the present invention. In FIG. 3, an electro-magnetic field intensity calculation device 10 comprises a component determination unit 11, a cooperation determination unit 12, an electro-magnetic wave analysis unit 13, a circuit analysis cooperation process unit 14 and an electro-magnetic field intensity calculation unit 15.

The component determination unit 11 determines whether an analysis target, such as each of components constituting an electric circuit contained in electronic equipment, is a linear component or a non-linear component.

The cooperation determination unit 12 starts the electro-magnetic wave analysis unit 13 if all the components constituting the electric circuit are linear based on determination result of the component determination unit11, and starts the circuit analysis cooperation process unit 14 if one or more circuit components are non-linear.

The electro-magnetic wave analysis unit 13 can calculate current flowing through the model without performing a circuit analysis, by dividing an analysis target model into, for example, patches, and calculates current flowing through the model using, for example, a time domain moment method, thereby performing an electro-magnetic wave analysis using a model containing all the linear components as an analysis target model.

The circuit analysis cooperation process unit 14 performs an electro-magnetic wave analysis by combining an electro-magnetic wave analysis and a circuit analysis if one or more of components constituting an electric circuit are non-linear. The circuit analysis cooperation process unit 14 divides an analysis target into a circuit analysis model to which a circuit analysis should be applied, an electro-magnetic wave analysis model to which an electro-magnetic wave analysis should be applied and one or more ports as the jointing point of these two models and analyzing the electro-magnetic wave emitted from the analysis target and calculates current flowing through the analysis target.

The electro-magnetic field intensity calculation unit 15 calculates the electro-magnetic field intensity of an electromagnetic wave emitted from electronic equipment, using the current calculation result of the electro-magnetic wave analysis unit 13 if all the components constituting an electric circuit which is included in the analysis target are linear, and using the current calculation result of the circuit analysis cooperation process unit 14 if one or more of the components constituting the electric circuit are non-linear.

Figure 4:
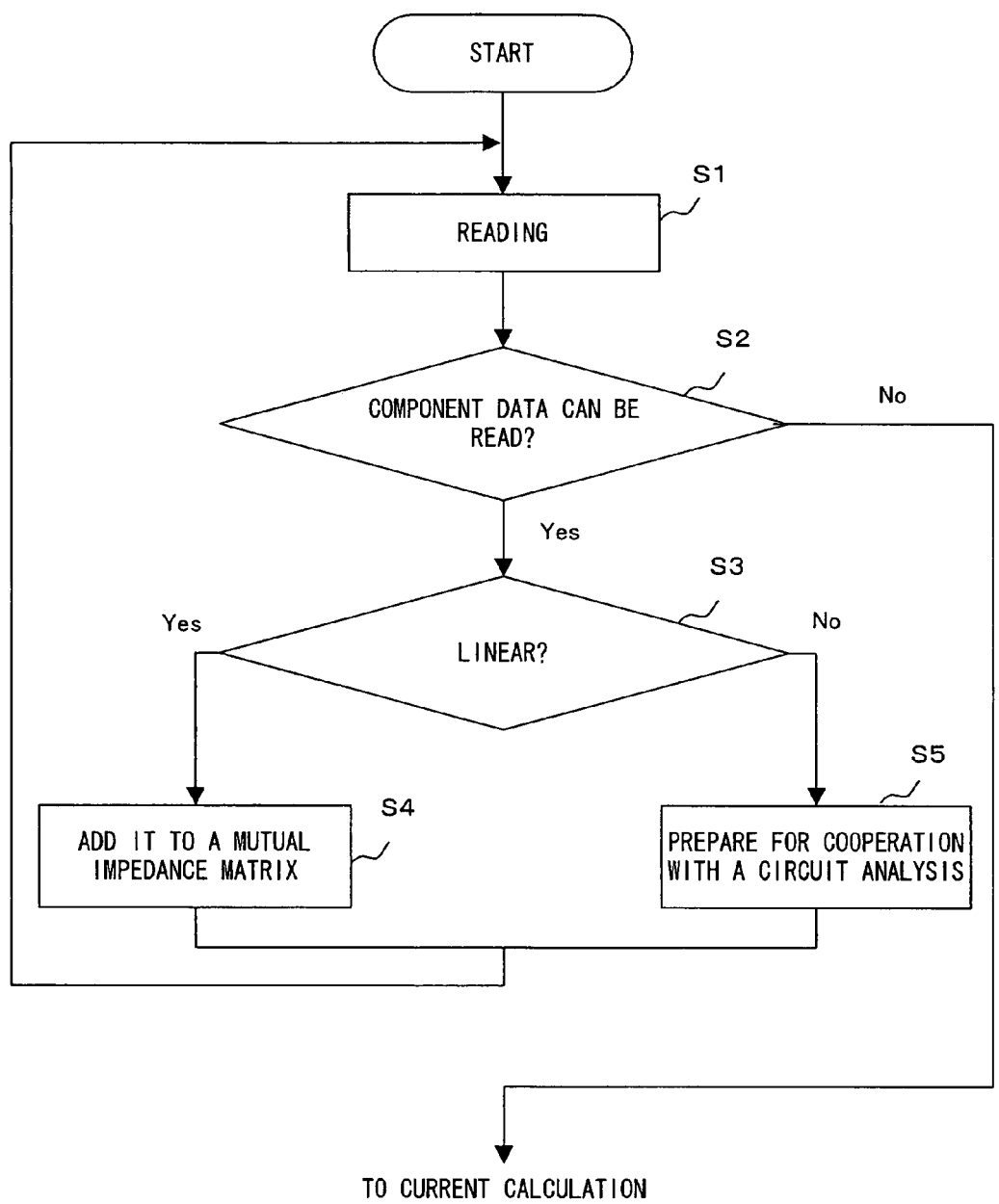
FIG. 4 is a basic flowchart showing the circuit component determination process in the preferred embodiment.

FIG. 4 is a basic flowchart showing the circuit component determination process in the preferred embodiment. When the process starts in FIG. 4, firstly, in step S1, circuit component data is read, and in step S2, it is determined whether the reading of the circuit data is completed, that is, whether the circuit data can be read. If the circuit data could be read, in step S3 it is determined whether the circuit component is linear. If the circuit component is linear, in step S4, after the value of the linear component is added to the value of a mutual impedance matrix component, which is described later, the processes of steps 1 and after are repeated. If it is non-linear, after in step S5, for example, the setting of a port, the voltage calculation preparation of a port and the like are performed, which are described later, the processes of steps 1 and after are repeated. When in step S2 it is determined that the circuit component data could not be read, the process proceeds to current calculation.

Figure 5:
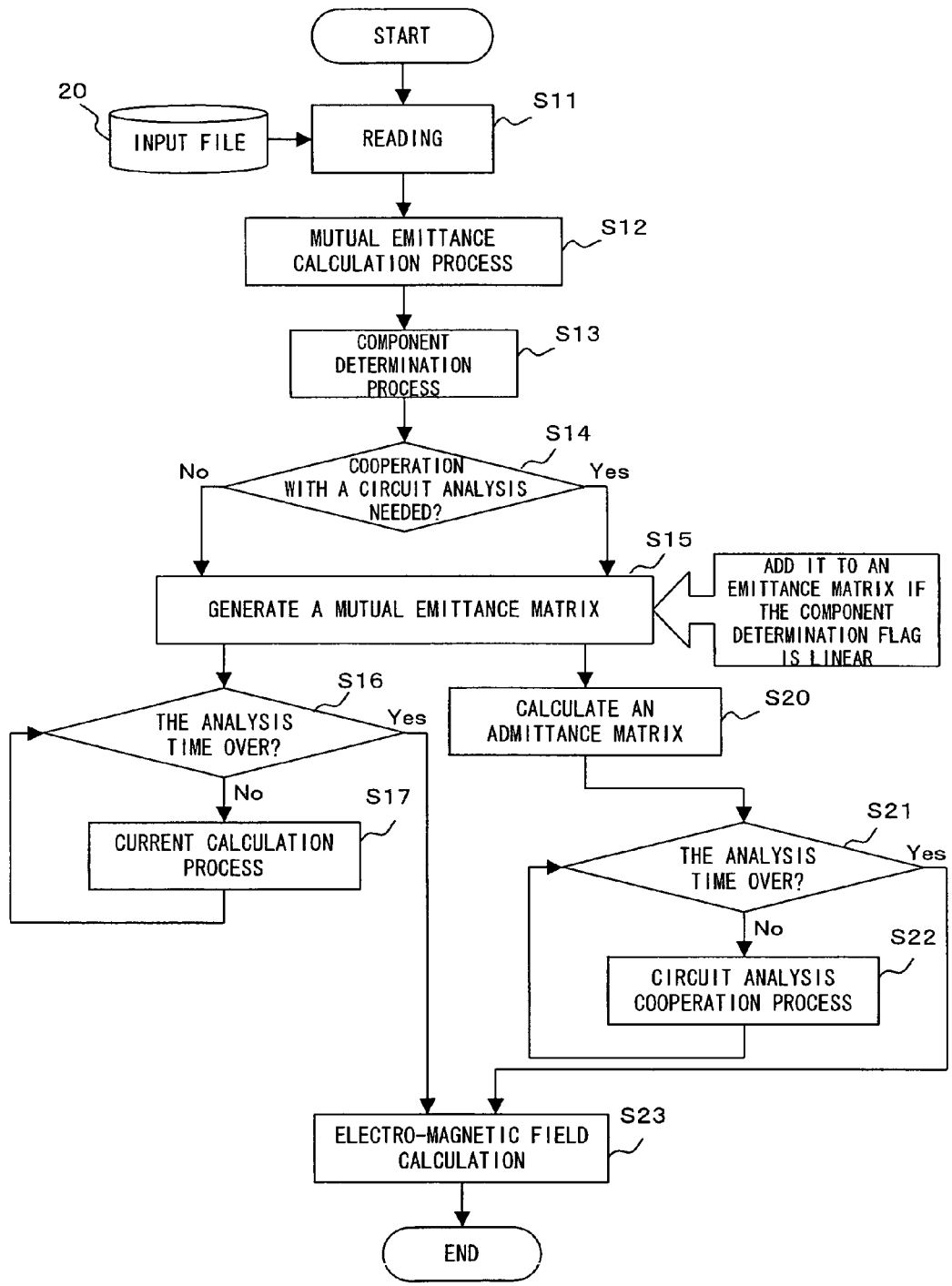
FIG. 5 is the entire flowchart showing the electro-magnetic field intensity calculation process in the preferred embodiment.

Next, the process of the present invention is described in more detail. FIG. 5 is the entire flowchart showing the electro-magnetic field intensity calculation process in the preferred embodiment. When the process starts in FIG. 5, firstly, in step S11, data is read from an input file 20. Data to be read here is not only data needed for the above-mentioned component determination process, but full data needed to calculate an electro-magnetic field intensity, such as a time interval as an analysis step width, component information and node information as data for circuit analysis, the location and size of each very small component constituting a model as data for a time domain moment method analysis, data about a material and the like.

Then, in step S12, mutual emittance, such as emittance between very small components constituting a time domain moment method model is calculated and so on.

Then, in steps 13 and 14, a component determination process and the necessity determination of a circuit analysis cooperation corresponding to the processes of the component determination unit 11 and cooperation determination unit 12, respectively, shown in FIG. 3 are performed, thereby determining whether the cooperation of an electro-magnetic wave analysis and a circuit analysis is needed.

In either case, in step S15, a mutual emittance matrix is generated. If the component is linear, its value is added to a corresponding emittance matrix component, according to the contents of a component determination flag, which is described later.

If no circuit analysis cooperation is needed, in step S16 it is determined whether an analysis time is over, by counting the number of time steps. If analysis time is not over, in step S17, a current calculation process is performed and the processes in steps S16 and after are repeated. If it is over, in step S23, an electro-magnetic field intensity is calculated, and the process terminates. The current calculation process in step S17 is described in detail later.

If the cooperation with a circuit analysis is needed, after the process in step S15, in step S20, an admittance matrix calculation process which is described later, is performed, and in step S21 it is determined whether the analysis time is over, by counting the number of time steps. If analysis time is not over, in step S22, a circuit analysis linking process is performed, and the processes in steps S21 and after are repeated. If it is over, in step S23, an electro-magnetic field intensity is calculated, and the process is terminates. The circuit analysis cooperation process in step S22 is described later.

FIG. 6 is the detailed flowchart of the circuit component determination process in step S13 of FIG. 5. In FIG. 6, after the same processes as in steps S11 and S12 of FIG. 5, in step S31 it is determined whether all the process is completed for all the circuit components. If the process is not completed for all the circuit components, in step S32, one of the component names is extracted, and in step S33 it is determined whether its leading character is one of R, L and C. If the leading character is one of R, L and C, in step S34, a linear flag is attached. If it is one of characters other than R, L and C, the processes in steps S31 and after are repeated after a non-linear flag is attached. When it is determined that the process is completed for all the components, the process proceeds to the circuit analysis cooperation necessity determination process shown in FIG. 5, that is, step S14.

In FIG. 6 it is assumed that it is determined whether a component is linear or non-linear, based on the leading character of a component description in circuit data. FIG. 7 shows an example of the description of the circuit component of data corresponding to each component in this case. In FIG. 7, data whose leading character is one of R, L and C represents a linear component. The component names are, for example, R1, L1, C1 and the like. In FIG. 7, M, VDD/VIN, T and X represent a metal-oxide semiconductor (MOS) transistor, a voltage source, a transmission line and a port as a connection point with a moment method, respectively.

Alternatively, instead of determining whether a component is linear or non-linear, based on the leading character of a component name in the component determination process, it can also be determined whether a component is linear or non-linear, based on a symbol which is stored in circuit data beforehand for that purpose. FIG. 8 shows an example of the description of component data in such a case. In FIG. 8, circuit component data is described under the rule that non-linear component data is inserted between symbols $SPICE and $END. In this case, it is determined that a component indicated by data inserted between these symbols is non-linear.

Next, the process of the electro-magnetic wave analysis unit 13 or circuit analysis cooperation processing unit 14, which is performed according to the determination result of the cooperation determination unit 12 shown in FIG. 3 is described. The process of the electro-magnetic wave analysis unit 13 is performed when all the components constituting an electric circuit are linear. In this case, current flowing through an analysis target can be calculated by performing, for example, only a time domain moment method, without performing a circuit analysis.

Figure 9:
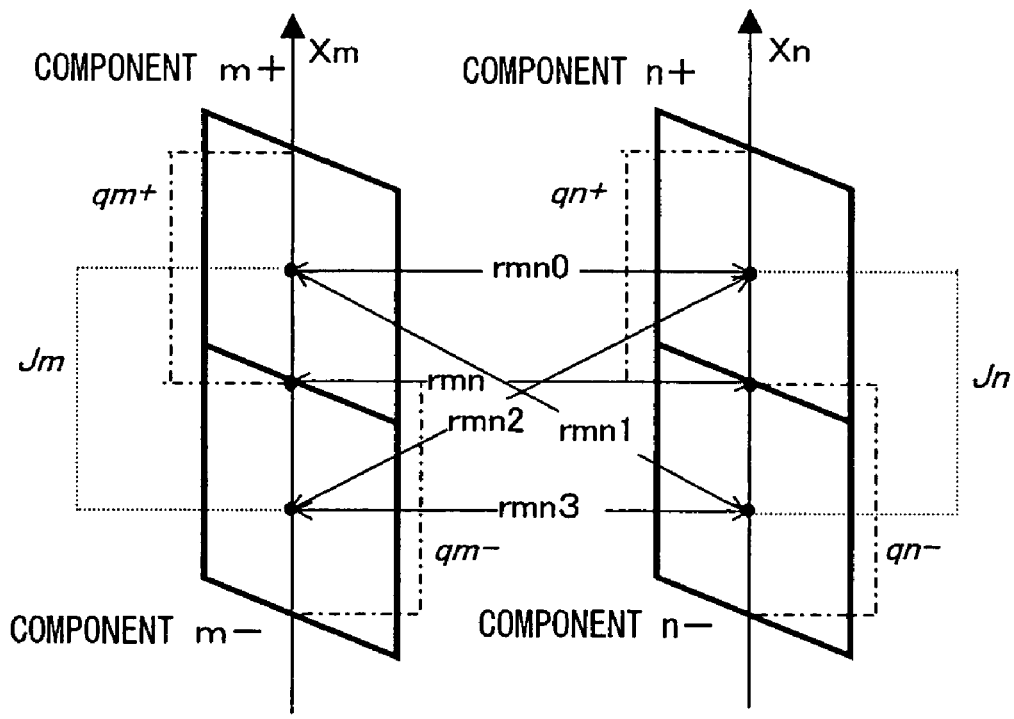
FIG. 9 explains the parameters of a component in the time domain moment method.

FIG. 9 shows the parameters of a component in the time domain moment method, such as a patch, a wire or the like. In FIG. 9 it is assumed that current flowing components $m^+$ and $m^-$ on an axis $X_m$, current flowing components $n^+$ and $n^-$ on an axis $X_n$ are $J_m$, $J_n$ respectively. The charge of component $m^+$, the charge of component $m^-$ $q_{m+}$, and the charges of other elements are similarly $q_{m-}$, $q_{n+}$ and $q_{n-}$, respectively. It is also assumed that each distance between the respective centers of elements are $r_{mn}$, $r_{mn0}$, $r_{mn1}$, $r_{mn2}$ and $r_{mn3}$. If these parameters are assigned to the integral equation of an electric field on a perfect conductor in a time domain, the following equation is obtained.

$$\sum_{n=1}^{N} a_{mn} J'_n\left(t - \frac{r_{mn}}{c}\right) + \sum_{n=1}^{N} b_{mn0} q_n\left(t - \frac{r_{mn0}}{c}\right) + \sum_{n=1}^{N} b_{mn1} q_n\left(t - \frac{r_{mn1}}{c}\right) + \sum_{n=1}^{N} b_{mn2} q_n\left(t - \frac{r_{mn2}}{c}\right) + \sum_{n=1}^{N} b_{mn3} q_n\left(t - \frac{r_{mn3}}{c}\right) = V_m(t) \quad (1)$$

In the above equation, $a_{mn}$, $b_{mn0}$, $b_{mn1}$, $b_{mn2}$ and $b_{mn3}$ are a vector potential between components $m^+$, $m^-$ and $n^+$, $n^-$, a scalar potential between components $m^+$ and $n^+$, a scalar potential between components $m^+$ and $n^-$, a scalar potential between components $m^-$ and $n^+$ and a scalar potential between components $m^-$ and $n^-$, respectively.

In the mutual emittance calculation process in step S12 of FIG. 5, these vector and scalar potentials are calculated. Vector and scalar potentials are calculated using the shape and physical value (permittivity and permeability) of a component and a distance between components.

If all the components constituting an electric circuit are linear, the respective values of linear components R, L and C is assigned to equation (1) as follows, and an electro-magnetic wave analysis process of the electro-magnetic wave analysis unit 13 shown in FIG. 3 is performed.

$$\sum_{n=1}^{N} (a_{mn} + L) J'_n\left(t - \frac{r_{mn}}{c}\right) + \sum_{n=1}^{N} \left(b_{mn0} + \frac{1}{C}\right) q_n\left(t - \frac{r_{mn0}}{c}\right) + \sum_{n=1}^{N} \left(b_{mn1} + \frac{1}{C}\right) q_n\left(t - \frac{r_{mn1}}{c}\right) + \sum_{n=1}^{N} \left(b_{mn2} + \frac{1}{C}\right) q_n\left(t - \frac{r_{mn2}}{c}\right) + \sum_{n=1}^{N} \left(b_{mn3} + \frac{1}{C}\right) q_n\left(t - \frac{r_{mn3}}{c}\right) + RJ_n\left(t - \frac{r_{mn}}{c}\right) = V_m(t) \quad (2)$$

$m = 1, 2, \ldots, N$

Next, the cooperation process of the circuit analysis and electro-magnetic wave analysis is described. FIG. 10 shows the modeling of an analysis target in this cooperation process. In this cooperation process, an analysis target is divided into a circuit analysis model 25 to which a circuit analysis method should be applied, an electro-magnetic wave analysis model 26 to which an electro-magnetic wave analysis method should be applied and a plurality of ports $27_1$, $27_2$, ..., $27_n$ as the jointing point of these two models, and an analysis process is performed.

Figure 11:
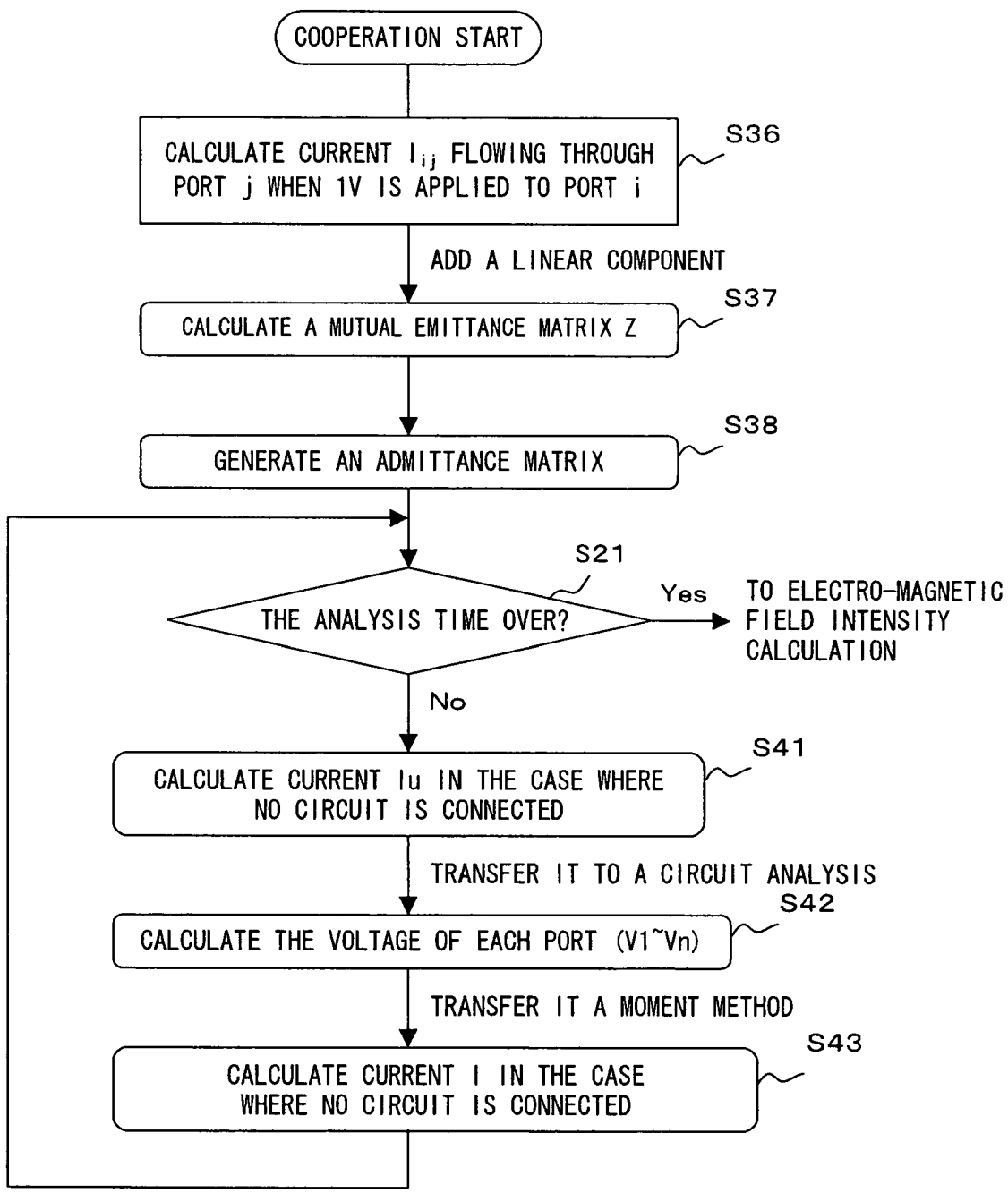
FIG. 11 is the detailed flowchart of the cooperation process.

FIG. 11 is the detailed flowchart of this cooperation process. In FIG. 11, the processes in steps S36 through S38 correspond to the generation process of a mutual emittance matrix in step S15 of FIG. 5 and the calculation process of an admittance matrix in step S20, and the processes in steps S41 through S43 correspond to the circuit analysis cooperation process in step S22.

In step S36, generally, current $I_{ij}$ flowing through the j-th port when a voltage 1[V] is applied to the i-th port of the plurality of ports is calculated. In step S37, a mutual emittance matrix Z used for the analysis to which a value corresponding to a linear component of components constituting an electric circuit is added, is generated. In step S38, an admittance matrix is generated. These processes are further described later.

In step S41, current $I_u$ flowing through each port in a state where no circuit is connected to each port shown in FIG. 10 is calculated by a time domain moment method, and the result is transferred to a circuit analysis process. Then, in step S42, voltages $V_1$–$V_n$ of each port are calculated, and the result is further transferred to the time domain moment method again. Then, in step S43, current I in the case where no circuit analysis model is connected is calculated assuming the voltages of each port are $V_1$–$V_n$. These processes are repeatedly performed while increasing the number of time steps until in step S21 it is determined that the analysis time is over.

Figure 12:
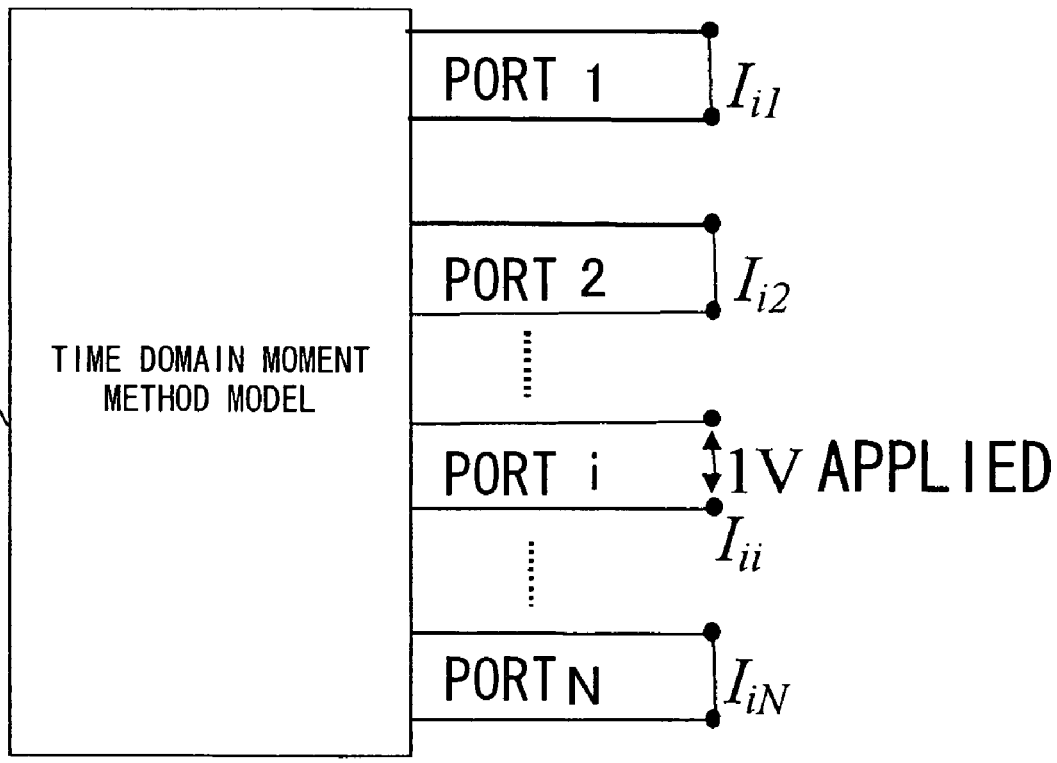
FIG. 12 explains how to calculate an admittance matrix.

FIG. 12 explains the basic way how to generate an admittance matrix in steps S36 through S38 of FIG. 11. In FIG. 12, a component $Y_{ij}$ located in the row i and column j of an admittance matrix can be calculated as follows, by, for example, calculating current $I_{ij}$ flowing a port j when applying a voltage 1[V], to the i-th port and short-circuiting the other ports.

$$Y_{i,j} = \frac{I_{i,j}[A]}{1[V]} \quad (3)$$

By repeating such a calculation, the following admittance matrix can be generated.

$$\begin{pmatrix} Y_{11} & Y_{12} & & Y_{1N} \\ Y_{21} & Y_{22} & & \vdots \\ & & \ddots & \vdots \\ Y_{N1} & \cdots & \cdots & Y_{NN} \end{pmatrix} \quad (4)$$

Next, the processes in steps S41 through S43 of FIG. 11, that is, the cooperation process of the electro-magnetic wave analysis and circuit an analysis is described. In this cooperation process, for example, a time domain moment method as the electro-magnetic wave analysis and a modified nodal analysis method (SPICE, etc.) as the circuit analysis are linked and an analysis is performed. Firstly, the summary of an analysis by the time domain moment method is described. In the time domain moment method, an analysis target model is divided into very small components, such as patches, wires or the like, and current flowing through each very small component is set like $I_1(t)$, $I_2(t)$, ..., $I_m(t)$ assuming that the number of very small components is m.

In the symbol notation of "matrix", "vector", "factor", "solution of an equation", "current", "voltage" and the like, of the following description, vector characters are notated by underlining them.

Then, the solution I(t) of the following linear simultaneous equation can be calculated using a matrix Z representing a mutual impedance between very small components, a vector I(t) representing current flowing through each very small component, the vector V(t) of a voltage applied to each port and a time delay component $R_e(t)$.

$$ZI(t) = R_e(t) + V(t) \quad (5)$$

In the above equation, matrix Z is a matrix with m rows and m columns, and each of vectors I(t) and V(t) is an m-dimensional vector with m components. The components of V(t) are voltage applied to each port. The value of a V component corresponding to current flowing through a very small component not connected to a port is 0, and that of a V component corresponding to current flowing through a very small component connected to a port becomes the value of voltage applied to the connected port.

Time delay component $R_e(t)$ is also called a retarded component. When current flows through each very small component divided by the time domain moment method, an electric field is emitted by the current behind the very small component with delay obtained by dividing a distance between the very small components by a light speed.

$R_e(t)$ is the voltage equivalent component of this electric field.

Lastly, an electro-magnetic field generated by current $I(t)$ flowing through the very small component is calculated, and the analysis by the time domain moment method terminates.

Next, how to link the time domain moment method with a circuit analysis method is described. As described above, it is assumed that the analysis target model of a time domain moment method model is divided into m very small components, and each of n ones ($n \leq m$) of the very small components is connected to one of n ports.

Firstly, the above-mentioned equation (5) is obtained in correction with the time domain moment method model. In this case, it is assumed that in equation (5), elements other than current $I(t)$ and the applied voltage $V(t)$ of each port are all known.

If there is no input from each port, that is, a port is not connected, the following equation holds true assuming that vector $V(t)$ of a voltage applied to each very small component is 0.

$$ZI_u(t) = R_e(t) \qquad (6)$$

In the above equation, $I_u(t)$ is a vector whose component is current flowing through each very small component of the time domain moment method model when a port is not connected. If it is assumed that the inverse matrix of a mutual impedance matrix Z is an admittance matrix Y, the following equation holds true.

$$I_u(t) = YR_e(t) \qquad (7)$$

Current flowing through the i-th very small component of m very small components becomes the i-th row of equation (7), and it is calculated as follows.

$$I_{ui}(t) = \sum_{j=1}^{m} Y_{ij} R_{ej}(t) \qquad (8)$$

In this case, current flowing through the other ports when a voltage is applied to each port is calculated. When a voltage $V^l$ is applied to a port l, current flowing the i-th very small component connected to the k-th port can be calculated as follows. The current is equivalent to current in the case where time delay component $R_e(t)$ is not taken into consideration in equation (5).

$$I_{pi}^k(t) = \sum_{l=1}^{n} Y^{kl} V^l \qquad (9)$$

The $Y^{kl}$ of the above equation is equivalent to admittance between the i-th very small component connected to the k-th port in the case where a voltage is applied to port l. The admittance corresponds one to one to the element $Y_{ij}$ of the admittance matrix Y of the time domain moment method model. Specifically, if the i(j)-th very small component of the time domain moment method model is connected to the k(l)-th port, $Y^{kl}$ is equal to $Y_{ij}$, to which attention must be paid.

If time delay component $R_e(t)$ is taken into consideration, current flowing through the i-th very small component becomes the sum of the current of equation (9) and current due to the time delay component when the i-th component of m very small components is connected to the k-th port of n ports, and it can be calculated as follows.

$$I_i^k(t) = \sum_{j=1}^{m} Y_{ij} R_{ej}(t) + \sum_{l=1}^{n} Y^{kl} V^l \qquad (10)$$
$$= I_{ui}^k + I_{pi}^k(t)$$

If the i-th component is connected to neither of the ports, current flowing through the component corresponds to only the time delay component, and it can be calculated as follows.

$$I_i(t) = \sum_{j=1}^{m} Y_{ij} R_{ej}(t) = I_{ui}(t) \qquad (11)$$

If these equations (10) and (11) are expressed using each matrix and vector, the following equations (12) and (13), respectively, are obtained.

$$I(t) = YR_e(t) + YV(t) \qquad (12)$$

$$I(t) = I_u(t) + YV(t) \qquad (13)$$

If equation (13) is written in a matrix form, the matrix of current flowing through each very small component can be obtained as follows.

$$\begin{pmatrix} I_1 \\ I_2 \\ \vdots \\ I_m \end{pmatrix} = \begin{pmatrix} I_{u1} \\ I_{u2} \\ \vdots \\ I_{um} \end{pmatrix} + \begin{pmatrix} Y_{11} & Y_{12} & \cdots & Y_{1m} \\ Y_{21} & Y_{22} & \cdots & Y_{2m} \\ \vdots & & & \vdots \\ Y_{m1} & Y_{m2} & \cdots & Y_{mm} \end{pmatrix} \begin{pmatrix} V^1 \\ V^2 \\ \vdots \\ V^m \end{pmatrix} \qquad (14)$$

In equation (14), as to each of components $V^1$ through $V^m$, the value of the applied voltage is assigned to a component corresponding to a very small component connected to a port, of very small components corresponding to each row, and the values of the other components are made 0. The element of a matrix Y becomes 0 except for an element corresponding to the $Y^{kl}$ of equation (10).

As described above, if the i-th very small component of the time domain moment method model is connected to the k-th port, current $I_i^k(t)$ flowing through the very small component is determined by $I_{ui}^k(t)$ as an independent current source and n voltage-dependent current sources $Y^{kl}V^l$ each of which is controlled by voltage $V^l$ applied to each port.

FIG. 13 shows a model in which the time domain moment method model is replaced with a current source connected to each port. In FIG. 13, for example, $I_u^n(t)$ and n voltage-dependent current sources, $Y^{n1}V^1$ through $Y^{nn}V^n$ are connected to port n as an independent current source and voltage-dependent current sources G, respectively. In this case, although independent current source $I_u^n(t)$ is equivalent to the $I_{ui}^k(t)$ of the first term in the right side of equation (10), in FIG. 13, its subscript is only u since the "i" of the i-th very small component to which the k-th port is connected is unknown.

In a circuit analysis, for example, a circuit analysis using SPICE or the like, V"(t) as the node voltage of each port can be calculated by solving the model shown in FIG. 13 by a circuit analysis method.

FIG. 14 explains a model in which the circuit analysis model is replaced with a voltage source, using the node voltage of each port calculated described above. V connected to each port is an independent voltage source, and its value is given by the node voltages $V^1$ through $V^n$ of each port calculated by a circuit analysis in FIG. 13. Then, an analysis by a time domain moment method is performed using the model shown in FIG. 14, and a vector I(t) composed of current $I_1(t), I_2(t), \ldots, I_m(t)$ flowing through m very small components is calculated. If current flowing through each very small component is calculated thus, an electro-magnetic field intensity by an emitted electro-magnetic wave can be calculated by a known method. Its description is omitted here.

Figure 15:
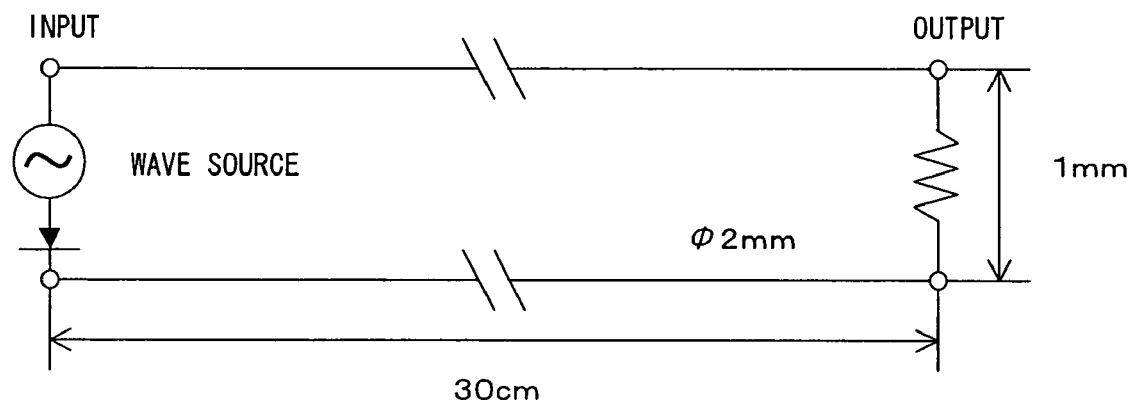
FIG. 15 shows a specific example of an electric circuit contained in an analysis target.

Then, the process of the preferred embodiment is further described using the electric circuit shown in FIG. 15 as a specific example. FIG. 15 shows a specific example of an electric circuit contained in an analysis target. In FIG. 15, a sine-wave wave source with a voltage of 1V, a frequency of 100 MHz and a diode are connected to its input terminal, and a load resistor of 276[Ω] for matching a transmission line is connected to its output terminal.

As described with reference to FIG. 3, in the preferred embodiment, if all the components constituting an electric circuit are linear, an electro-magnetic wave analysis is performed without performing a circuit analysis. In this case, all the linear components are added, for example, to an admittance matrix, and current is calculated using, for example, a time domain moment method.

In FIG. 15, since a diode is included as a non-linear component, the cooperation process of the electro-magnetic analysis and circuit analysis is performed. However, in this cooperation process, only one port corresponding to the diode as a port described with reference to FIG. 10 is provided and no port corresponding to the load resistor is provided. The load resistor is added to an admittance matrix on the time domain moment method model side, and calculation is performed.

A linear component like this load resistor is added to the diagonal element of an emittance matrix (Z). If the linear component is, for example, the load of current $J_m$ described with reference to FIG. 9, a calculation corresponding to a linear component is performed as in equation (2) in the calculation of $Z_{mm}$.

In the representation of an admittance matrix, a linear component factor is added as follows, assuming the admittance factor of a linear component to be $X_{ii}$.

$$\begin{pmatrix} Y_{11}+X_{11} & \cdot & \cdot & \cdot \\ \cdot & Y_{22}+X_{22} & \cdot & \cdot \\ \cdot & \cdot & \cdot & \cdot \\ \cdot & \cdot & \cdot & Y_{nn}+X_{nn} \end{pmatrix} \quad (15)$$

For example, if a linear component is inserted and connected between the two terminals of a print-wired board, the linear component is inserted and connected between two patches in parallel by dividing the print-wired board into patches. Therefore, their admittance factors must be summed.

As described above, in the preferred embodiment, all the components constituting an electric circuit contained in an analysis target are linear, no linking process of the electro-magnetic wave analysis and circuit analysis is performed, and for example, only a process by a time domain moment method is performed as an electro-magnetic wave analysis. Therefore, there is no need for time matching between the electro-magnetic wave analysis and circuit analysis, thereby improving a processing speed.

Even when all components are not linear, a port as the jointing point of an electro-magnetic wave analysis model and a circuit analysis model described with reference to FIG. 10 can be limited to only a port corresponding to a non-linear component. Therefore, the respective numbers of rows and columns of an admittance matrix can be reduced and a simultaneous equation can be calculated in a shorter time. Furthermore, for example, the respective numbers of the independent current sources and voltage-dependent current sources described with reference to FIG. 13 can be reduced, thereby reducing a calculation time.

Figure 16:
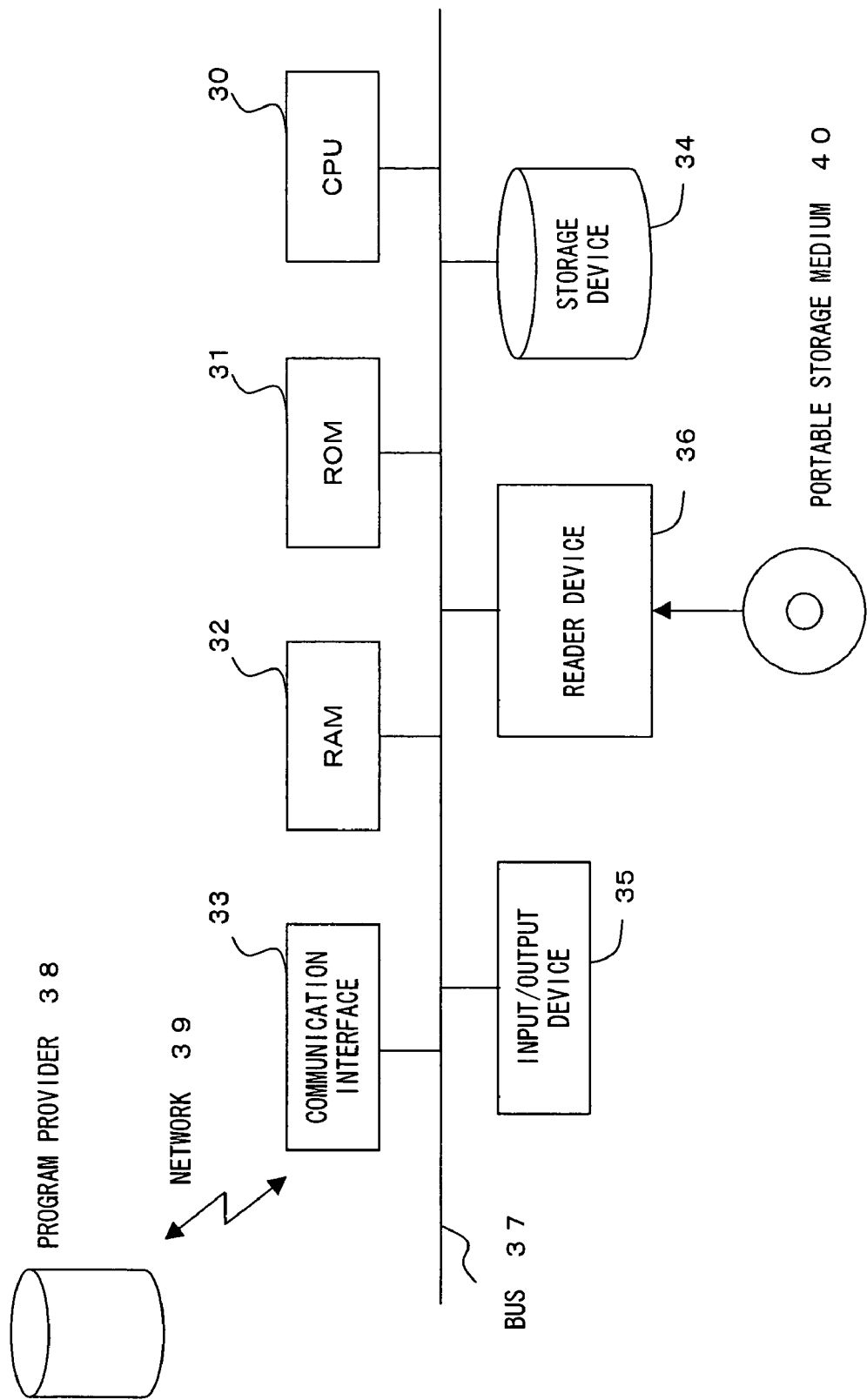
FIG. 16 shows how to load a program onto a computer in the preferred embodiment.

So far the electro-magnetic field intensity calculation device of the present invention has been described in detail, this electro-magnetic field intensity calculation device can be configured as a general computer system. FIG. 16 shows the configuration of such a computer system, that is, hardware environment.

In FIG. 16, a computer system comprises a central processing unit (CPU) 30, read-only memory (ROM) 31, random-access memory (RAM) 32, a communication interface 33, a storage device 34, an input/output device 35, a portable storage medium reader device 36 and a bus 37 for jointing all the components to each other.

For the storage device 34, a variety of types of storage devices, such as a hard disk, magnetic disk or the like can be used. Such a storage device 34 or the ROM 31 stores the programs shown in the flowcharts in FIGS. 4 through 6 and 11. By the CPU 30 executing such a program, an electro-magnetic field intensity can be calculated in accordance with whether a component constituting an electric circuit in the preferred embodiment is linear or non-linear.

Such a program can be stored in, for example, the storage device 34 by a program provider 38 via a network 39 and the communication interface 33, and be executed by the CPU 30. Alternatively, such a program can be stored in a portable storage medium 40 sold and distributed in the market, be set in the reader device 36 and be executed by the CPU 30.

For the portable storage medium 40, a variety of types of storage media, such as a CD-ROM, a flexible disk, an optical disk, a magneto-optical disk or the like, can be used. By the reader device 36 reading the program stored in such a storage medium, the electro-magnetic field intensity can be calculated in the preferred embodiment.

As described in detail above, according to the present invention, it can be determined whether a component constituting an electric circuit contained in an analysis target is linear or non-linear. Then, if all the components are linear, an electro-magnetic field intensity can be calculated only by an electro-magnetic wave analysis without performing a circuit analysis, thereby improving a calculation speed.

Even when all the components are not always linear, a port as the jointing point of the electro-magnetic wave analysis model and circuit analysis model can be limited to only a port corresponding to a non-linear component, thereby reducing the matching time between the electromagnetic wave analysis and circuit analysis and improving a processing speed as a whole. Thus, the present invention greatly contributes the improvement of the efficiency of the electro-magnetic field intensity calculation process.

The present invention can be used in manufacturing industries of electric equipment having a possibility to emit an electro-magnetic wave, or the like and in all the industries using such electronic equipment.

What is claimed is:

1. An electro-magnetic intensity calculation device which calculates intensity of an electro-magnetic field generated by an electro-magnetic wave emitted by an analysis target, comprising:
   a circuit component determination unit for determining whether a component constituting an electric circuit contained in the analysis target is linear or non-linear;
   an electro-magnetic wave analysis processing unit for analyzing an electro-magnetic wave emitted from the analysis target, using an analysis target model containing the linear component when all the components are linear;
   a cooperation process unit of an electro-magnetic wave analysis and a circuit analysis, for dividing the analysis target into a circuit analysis model to which a circuit analysis method is applied, an electro-magnetic wave analysis model and one or more ports as a jointing point of the two models and analyzing an electro-magnetic wave emitted from the analysis target, when one or more of the components are non-linear.

2. The electro-magnetic intensity calculation device according to claim 1, wherein
   said cooperation process unit of the circuit analysis and electro-magnetic wave analysis disposes an independent current source and a voltage-dependent current source at each of the one or more ports and calculates a voltage of each port by the circuit analysis,
   disposes a voltage source at each port, using the calculated voltage value and calculates current flowing through the analysis target by the electro-magnetic wave analysis, and
   increments an analysis time in steps and repeats the voltage calculation of the port and the calculation of current flowing through the analysis target.

3. The electro-magnetic intensity calculation device according to claim 2, wherein
   said cooperation process unit of a circuit analysis and an electro-magnetic wave analysis uses a time domain moment method as the electro-magnetic wave analysis method.

4. The electro-magnetic intensity calculation device according to claim 3, wherein
   said cooperation process unit of a circuit analysis and an electro-magnetic wave analysis divides the analysis target into very small components in order to apply the time domain moment method, prior to voltage calculation by the circuit analysis, and
   sets the voltage-dependent current source, using a part of elements of an admittance matrix composed of admittance between the very small components.

5. The electro-magnetic intensity calculation device according to claim 2, wherein
   only a port corresponding to a non-linear component is provided as the one or more ports, and
   said cooperation process unit of a circuit analysis and an electro-magnetic wave analysis calculates current flowing through the analysis target, using an electro-magnetic wave analysis model containing a linear component in the electro-magnetic wave analysis.

6. The electro-magnetic intensity calculation device according to claim 2, wherein
   said cooperation process unit of a circuit analysis and an electro-magnetic wave analysis calculates current flowing through each port without any voltage applied to any of the one or more ports prior to voltage calculation by the circuit analysis, and
   sets the independent current source, using the calculated current value.

7. The electro-magnetic intensity calculation device according to claim 1, wherein
   said circuit component determination unit determines whether a component is linear or non-linear in accordance with a name of a component.

8. The electro-magnetic intensity calculation device according to claim 1, wherein
   said circuit component determination unit determines whether a component is linear or non-linear in accordance with a predetermined symbol in data needed for the circuit analysis.

9. The electro-magnetic intensity calculation device according to claim 1, wherein
   said cooperation process unit of a circuit analysis and an electro-magnetic wave analysis uses a modified nodal analysis method as the circuit analysis method.

10. An electro-magnetic intensity calculation method which calculates intensity of an electro-magnetic field generated by an electro-magnetic wave emitted by an analysis target, comprising:
    determining whether a component constituting an electric circuit contained in the analysis target is linear or non-linear;
    analyzing an electro-magnetic wave emitted from the analysis target, using an analysis target model containing the linear component when all the components are linear;
    dividing the analysis target into a circuit analysis model to which a circuit analysis method is applied, an electro-magnetic wave analysis model and one or more ports as a jointing point of the two models and analyzing an electro-magnetic wave emitted from the analysis target, when one or more of the components are non-linear.

11. A program to be used by a computer for calculating an electro-magnetic field intensity generated by an electro-magnetic wave emitted from an analysis target, for enabling a computer to perform a process, said process comprising:
    determining whether a component constituting an electric circuit contained in the analysis target is linear or non-linear;
    analyzing an electro-magnetic wave emitted from the analysis target, using an analysis target model containing the linear component when all the components are linear;
    dividing the analysis target into a circuit analysis model to which a circuit analysis method is applied, an electro-magnetic wave analysis model and one or more ports as a jointing point of the two models and analyzing an electro-magnetic wave emitted from the analysis target, when one or more of the components are non-linear.

12. A computer-readable portable storage medium on which a program for enabling a computer to perform a process, said process comprising:
    determining whether a component constituting an electric circuit contained in the analysis target is linear or non-linear;

analyzing an electro-magnetic wave emitted from the analysis target, using an analysis target model containing the linear component when all the components are linear;

dividing the analysis target into circuit analysis model to which a circuit analysis method is applied, an electro-magnetic wave analysis model and one or more ports as a jointing point of the two models and analyzing an electro-magnetic wave emitted from the analysis target, when one or more of the components are non-linear.

* * * * *

UNITED STATES PATENT AND TRADEMARK OFFICE
CERTIFICATE OF CORRECTION

| | | |
|---|---|---|
| PATENT NO. | : 7,027,941 B2 | Page 1 of 1 |
| APPLICATION NO. | : 11/146326 | |
| DATED | : April 11, 2006 | |
| INVENTOR(S) | : Kenji Nagase et al. | |

It is certified that error appears in the above-identified patent and that said Letters Patent is hereby corrected as shown below:

Column 17, Line 5, claim 12 after "into" insert --a--.

Signed and Sealed this

Seventh Day of November, 2006

JON W. DUDAS
*Director of the United States Patent and Trademark Office*